United States Patent
Oshiyama et al.

(10) Patent No.: US 10,536,659 B2
(45) Date of Patent: Jan. 14, 2020

(54) SOLID-STATE IMAGE CAPTURING ELEMENT, MANUFACTURING METHOD THEREFOR, AND ELECTRONIC DEVICE

(71) Applicant: SONY SEMICONDUCTOR SOLUTIONS CORPORATION, Kanagawa (JP)

(72) Inventors: Itaru Oshiyama, Kanagawa (JP); Hirotsugu Takahashi, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 21 days.

(21) Appl. No.: 15/995,203

(22) Filed: Jun. 1, 2018

(65) Prior Publication Data

US 2018/0288352 A1 Oct. 4, 2018

Related U.S. Application Data

(63) Continuation of application No. 15/035,300, filed as application No. PCT/JP2014/080320 on Nov. 17, 2014, now Pat. No. 10,009,564.

(30) Foreign Application Priority Data

Nov. 29, 2013 (JP) .................................. 2013-247107

(51) Int. Cl.
*H04N 5/3745* (2011.01)
*H01L 31/0224* (2006.01)
(Continued)

(52) U.S. Cl.
CPC ....... *H04N 5/3745* (2013.01); *H01L 27/1463* (2013.01); *H01L 27/14623* (2013.01);
(Continued)

(58) Field of Classification Search
CPC .. H04N 5/3745; H04N 5/374; H01L 31/0328; H01L 31/0322; H01L 31/022466;
(Continued)

(56) References Cited

U.S. PATENT DOCUMENTS 7,378,691 B2 5/2008 Geshi et al.
8,338,901 B2 12/2012 Ueno et al.
(Continued)

FOREIGN PATENT DOCUMENTS

CN 101312205 A 11/2008
CN 102569313 A 7/2012
(Continued)

OTHER PUBLICATIONS

Notice of Allowance and Fees Due for U.S. Appl. No. 15/035,300, dated Feb. 27, 2018, 08 pages.
(Continued)

*Primary Examiner* — Seung C Sohn
(74) *Attorney, Agent, or Firm* — Chip Law Group

(57) ABSTRACT

The present disclosure relates to a solid-state image capturing element, a manufacturing method therefor, and an electronic device, which are capable of controlling a thickness of a depletion layer. The solid-state image capturing element includes pixels each in which a photoelectric conversion film configured to perform photoelectric conversion on incident light and a fixed charge film configured to have a predetermined fixed charge are stacked on a semiconductor substrate. The technology of the present disclosure can be applied to, for example, back surface irradiation type solid-state image capturing elements, image capturing devices such as digital still cameras or video cameras, mobile terminal devices having an image capturing function, and electronic devices using a solid-state image capturing element as an image capturing unit.

20 Claims, 13 Drawing Sheets

(51) Int. Cl.
*H01L 27/146* (2006.01)
*H04N 5/374* (2011.01)
*H01L 31/032* (2006.01)
*H01L 31/0328* (2006.01)

(52) U.S. Cl.
CPC .............. *H01L 27/14625* (2013.01); *H01L 31/022466* (2013.01); *H01L 31/0322* (2013.01); *H01L 31/0328* (2013.01); *H04N 5/374* (2013.01); *H01L 27/1464* (2013.01)

(58) Field of Classification Search
CPC .......... H01L 27/14625; H01L 27/1463; H01L 27/14623; H01L 27/1464
USPC ...................................................... 250/208.1
See application file for complete search history.

(56) References Cited

U.S. PATENT DOCUMENTS

| | | | |
|---|---|---|---|
| 2008/0290382 | A1 | 11/2008 | Hirota |
| 2010/0024862 | A1* | 2/2010 | Tawada ................. C23C 14/086 136/244 |
| 2011/0187912 | A1 | 8/2011 | Arayashiki et al. |
| 2012/0146173 | A1 | 6/2012 | Ohta et al. |
| 2012/0188397 | A1 | 7/2012 | Ohta |
| 2012/0217494 | A1 | 8/2012 | Okino et al. |
| 2012/0217498 | A1* | 8/2012 | Yamanaka .......... H01L 27/1461 257/48 |
| 2012/0217602 | A1 | 8/2012 | Enomoto |

FOREIGN PATENT DOCUMENTS

| | | |
|---|---|---|
| CN | 102623463 A | 8/2012 |
| CN | 102683358 A | 9/2012 |
| EP | 1995783 A2 | 11/2008 |
| EP | 2146376 A1 | 1/2010 |
| JP | 2007-123721 A | 5/2007 |
| JP | 2008-294175 A | 12/2008 |
| JP | 2008-294176 A | 12/2008 |
| JP | 2008-306154 A | 12/2008 |
| JP | 2011-100845 A | 5/2011 |
| JP | 2011-159848 A | 8/2011 |
| JP | 2012-004443 A | 1/2012 |
| JP | 2012-124318 A | 6/2012 |
| JP | 2012-156310 A | 8/2012 |
| JP | 2012-178457 A | 9/2012 |
| KR | 10-2008-0103463 A | 11/2008 |
| KR | 10-2012-0099336 A | 9/2012 |
| TW | 200906183 A | 2/2009 |
| TW | 201234571 A | 8/2012 |
| WO | 2008/139644 A1 | 11/2008 |
| WO | 2011/055475 A1 | 5/2011 |

OTHER PUBLICATIONS

International Search Report and Written Opinion of PCT Application No. PCT/JP2014/080320, dated Feb. 10, 2015, 08 pages of English Translation and 07 pages of ISRWO.
International Preliminary Report on Patentability of PCT Application No. PCT/JP2014/080320, dated Jun. 9, 2016, 09 pages of English Translation and 04 pages of IPRP.

* cited by examiner

SOLID-STATE IMAGE CAPTURING ELEMENT, MANUFACTURING METHOD THEREFOR, AND ELECTRONIC DEVICE

CROSS REFERENCES TO RELATED APPLICATIONS

The present application is a continuation application of U.S. patent application Ser. No. 15/035,300, filed May 9, 2016, which is a National Stage Entry of PCT/JP2014/080320, filed Nov. 17, 2014, and claims the benefit of priority from prior Japanese Patent Application JP 2013-247107, filed Nov. 29, 2013, the entire content of which is hereby incorporated by reference.

TECHNICAL FIELD

The present disclosure relates to a solid-state image capturing element, a manufacturing method therefor, and an electronic device, and more particularly, to a solid-state image capturing element, a manufacturing method therefor, and an electronic device, which are capable of controlling a thickness of a depletion layer.

BACKGROUND ART

A photoelectric conversion device and a solid-state image capturing device using a chalcopyrite compound semiconductor as a photoelectric conversion film have been proposed.

For example, Patent Literature 1 discloses a photoelectric conversion device having a structure in which holes obtained by photoelectric conversion performed by a chalcopyrite compound semiconductor are accumulated in a capacitor through a lower electrode, and surplus electrons are transferred to an upper electrode.

Patent Literature 2 discloses a solid state image capturing device having a structure in which photoelectrons obtained by photoelectric conversion performed by a chalcopyrite compound semiconductor are accumulated in a silicon substrate, and surplus holes are transferred from an upper electrode.

CITATION LIST

Patent Literature

Patent Literature 1: JP 2007-123721A
Patent Literature 2: JP 2012-004443A

SUMMARY OF INVENTION

Technical Problem

However, in the structure disclosed in Patent Literature 1, since a photodiode is hardly depleted, a reset noise is hardly removed. In the structure disclosed in Patent Literature 2, a photodiode can be depleted, but it is hard to control the thickness of the depletion layer.

The present disclosure was made in light of the foregoing, and enables the thickness of the depletion layer to be controlled.

Solution to Problem

According to a first aspect of the present disclosure, there is provided a solid-state image capturing element, including: pixels each including a photoelectric conversion film and a fixed charge film stacked on a semiconductor substrate, the photoelectric conversion film being configured to perform photoelectric conversion on incident light, the fixed charge film being configured to have a predetermined fixed charge.

According to a second aspect of the present disclosure, there is provided a method of manufacturing a solid-state image capturing element, including: in forming pixels of the solid-state image capturing element, forming a photoelectric conversion film configured to perform photoelectric conversion on incident light on a semiconductor substrate; and forming a fixed charge film having a predetermined fixed charge on the photoelectric conversion film.

According to a third aspect of the present disclosure, there is provided an electronic device, including: a solid-state image capturing element including pixels each of which includes a photoelectric conversion film and a fixed charge film stacked on a semiconductor substrate, the photoelectric conversion film being configured to perform photoelectric conversion on incident light, the fixed charge film being configured to have a predetermined fixed charge.

In the first to third aspects of the present disclosure, in a pixel, a photoelectric conversion film that performs photoelectric conversion on incident light and a fixed charge film having a predetermined fixed charge are stacked on a semiconductor substrate.

The solid-state image capturing element or the electronic device may be an independent device or may be a module incorporated into another device.

Advantageous Effects of Invention

According to the first to third aspect of the present disclosure, it is possible to control the thickness of the depletion layer.

The effect described herein is not necessarily limited, and any effect described in the present disclosure may be included.

DESCRIPTION OF EMBODIMENTS

Hereinafter, modes (hereinafter, referred to as "embodiments") for carrying out the present disclosure will be described. A description will proceed in the following order.
1. Exemplary schematic configuration of solid-state image capturing element
2. Pixel according to first embodiment (structure example of n-type semiconductor region-photoelectric conversion film-fixed charge film-insulation film)
3. Pixel according to second embodiment (structure example of n-type semiconductor region-photoelectric conversion film-insulation film-fixed charge film-insulation film)
4. Manufacturing method
5. Application example to electronic device <1. Exemplary Schematic Configuration of Solid-State Image Capturing Element>

Figure 1:
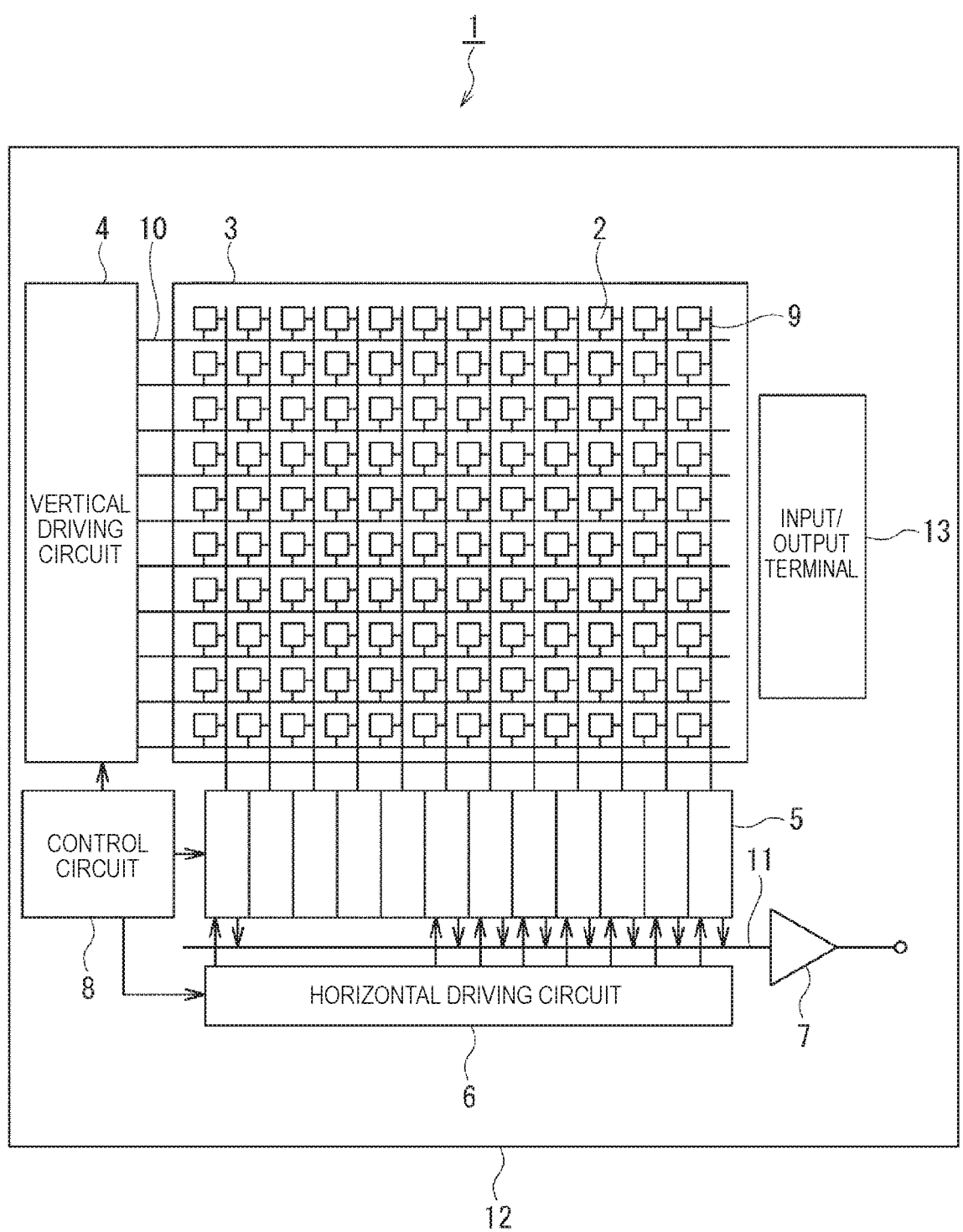
FIG. 1 is a diagram illustrating a schematic configuration of a solid-state image capturing element according to the present disclosure.

FIG. 1 illustrates a schematic configuration of a solid-state image capturing element according to the present disclosure.

A solid-state image capturing element 1 of FIG. 1 is configured to include a pixel array unit 3 in which pixels 2 are arranged on a semiconductor substrate 12 using, for example, silicon (Si) as a semiconductor in a two-dimensional (2D) array form and a peripheral circuit unit arranged therearound. The peripheral circuit unit includes a vertical driving circuit 4, column signal processing circuits 5, a horizontal driving circuit 6, an output circuit 7, a control circuit 8, and the like.

Each of the pixels 2 is configured with a photodiode serving as a photoelectric conversion element and a plurality of pixel transistors. For example, a plurality of pixel transistors are configured with four MOS transistors, that is, a transfer transistor, a selecting transistor, a reset transistor, and an amplifying transistor.

The pixels 2 may have a shared pixel structure. This pixel sharing structure includes a plurality of photodiodes, a plurality of transfer transistors, a shared floating diffusion (a floating diffusion region), and a shared pixel transistor. In other words, in the shared pixel, the photodiodes and the transfer transistors configuring a plurality of unit pixels share another pixel transistor.

The control circuit 8 receives data for instructing an input clock, an operation mode, or the like, and outputs data such as internal information of the solid-state image capturing element 1. In other words, the control circuit 8 generates a clock signal and a control signal serving as a reference of operations of the vertical driving circuit 4, the column signal processing circuits 5, the horizontal driving circuit 6, and the like based on a vertical synchronous signal, a horizontal synchronous signal, and a master clock. Then, the control circuit 8 outputs the generated clock signal and the control signal to the vertical driving circuit 4, the column signal processing circuits 5, the horizontal driving circuit 6, and the like.

The vertical driving circuit 4 is configured with, for example, a shift register, and selects a pixel driving line 10, supplies pulses for driving the pixels 2 to the selected pixel driving line 10, and drives the pixels 2 in units of rows. In other words, the vertical driving circuit 4 selectively scans the pixels 2 of the pixel array unit 3 sequentially in the vertical direction in units of rows, and supplies pixel signals based on signal charges generated according to an amount of received light in the photoelectric conversion units of the pixels 2 to the column signal processing circuits 5 via a vertical signal line 9.

The column signal processing circuit 5 is arranged for each column of the pixels 2, and performs signal processing such as noise reduction on the signals output from the pixels 2 of one row for each column of pixels. For example, the column signal processing circuit 5 performs signal processing such as correlated double sampling (CDS) for removing pixel-specific fixed pattern noise and AD conversion.

The horizontal driving circuit 6 is configured with, for example, a shift register, and sequentially outputs horizontal scan pulses, sequentially selects the column signal processing circuits 5, and outputs the pixel signals of the column signal processing circuits 5 to a horizontal signal line 11.

The output circuit 7 performs signal processing on the signals sequentially supplied from the column signal processing circuits 5 via the horizontal signal line 11, and outputs resulting data. For example, the output circuit 7 may perform only buffering or may perform various types of digital signal processing such as black level adjustment and column variation correction. An input/output terminal 13 exchanges a signal with the outside.

The solid-state image capturing element 1 having the above configuration is a CMOS image sensor called a column AD system in which the column signal processing circuits 5 performing the CDS process and the AD conversion process are arranged for each column of pixels.

<2. Pixel According to First Embodiment>

Figure 2:
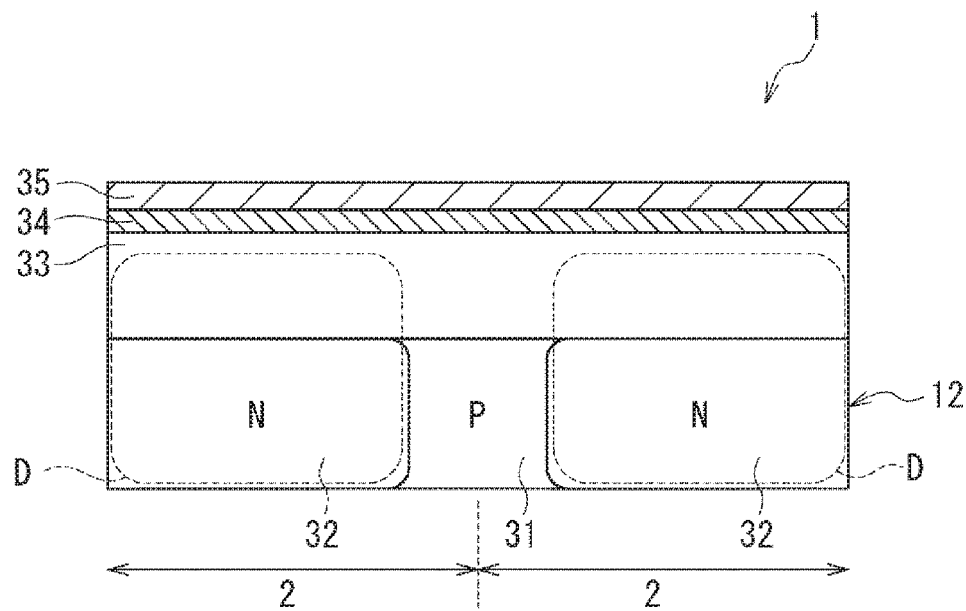
FIG. 2 is a schematic configuration cross-sectional view of a pixel according to a first embodiment.

FIG. 2 illustrates a schematic configuration cross-sectional view of a pixel 2 according to a first embodiment.

In the solid-state image capturing element 1, as illustrated in FIG. 2, n-type semiconductor regions 32 serving as a charge accumulation portion are formed in a p-type well region 31 of the semiconductor substrate 12 for every pixel 2.

A photoelectric conversion film 33 that performs photoelectric conversion on the incident light is formed on one surface, that is, the top surface of the semiconductor substrate 12. A conductivity type of the photoelectric conversion film 33 is a p type, and a photodiode (PD) is configured with a pn junction between the p-type photoelectric conversion film 33 and the n-type semiconductor region 32, and a depletion layer D is formed as indicated by a dashed line in FIG. 2.

The photoelectric conversion film 33 is formed, for example, using $CuInSe_2$ that is a compound semiconductor having a chalcopyrite structure. $CuInSe_2$ is higher in an optical-absorption coefficient than other materials, and, particularly, is about orders of magnitude higher than a silicon single crystal. For this reason, $CuInSe_2$ can completely absorb visible light through a thin film and thus can be used to form the charge accumulation region in the semiconductor substrate 12.

For example, the photoelectric conversion film 33 may be formed using any other compound semiconductor having the chalcopyrite structure such as a compound semiconductor having the chalcopyrite structure constituted by a copper-aluminum-gallium-indium-sulfur-selenium-based mixed crystal or a compound semiconductor having the chalcopyrite structure constituted by a copper-aluminum-gallium-indium-zinc-sulfur-selenium-based mixed crystal.

A fixed charge film 34 having a negative fixed charge is formed on the top surface of the photoelectric conversion film 33. The fixed charge film 34 may be formed, for example, using an oxide film such as hafnium oxide, tantalum oxide, aluminum oxide, zirconium oxide, gadolinium oxide, titanium oxide, lanthanum oxide, or yttrium oxide. In other words, the fixed charge film 34 may be formed of an oxide film containing at least one of hafnium, aluminum, titanium, tantalum, lanthanum, yttrium, gadolinium, and zirconium. In the example of FIG. 2, the fixed charge film 34 is formed of one layer, but the fixed charge film 34 may be formed such that two layers are stacked.

The fixed charge film 34 may be formed with a film thickness, for example, within a range of 10 nm to 100 nm. Since an internal electric field can be applied in the photoelectric conversion film 33 and the fixed charge film 34, the thickness of the depletion layer D in the photoelectric conversion film 33 can be controlled.

An insulation film 35 is formed on the top surface of the fixed charge film 34. For example, silicon oxide, silicon nitride, or the like may be used as a material of the insulation film 35. The insulation film 35 can be formed with a film thickness within a range of 0 to 500 nm or may be omitted. For example, when sensitivity is emphasized, the insulation film 35 is not formed or thinly formed, and when device characteristics (suggestive characteristics or the like) are emphasized, the insulation film 35 can be formed thickly within a range of 0 to 500 nm.

Although not illustrated, a color filter layer and an on-chip lens are stacked and formed on the top surface of the insulation film 35. In the color filter layer, a red filter, a green filter, and a blue filter are arranged, for example, in a Bayer array form in units of pixels.

Meanwhile, a read circuit that includes a plurality of pixel transistors and reads charges accumulated in the n-type semiconductor region 32 and an multi-layer interconnection layer including a plurality of interconnection layers with an inter-layer insulation film interposed therebetween are formed on the other surface, that is, the bottom surface of the semiconductor substrate 12. The p-type well region 31 of the semiconductor substrate 12 is connected to a ground (GND) of the multi-layer interconnection layer therebelow.

The solid-state image capturing element 1 in which the pixel 2 has the above-described configuration is a back surface irradiation type MOS type solid-state image capturing element in which light is incident from the back surface side opposite to the front surface side of the semiconductor substrate 12 on which the pixel transistor is formed.

<Band Diagram>

The flows of electrons and holes of the pixel 2 according to the first embodiment will be described with reference to FIGS. 3 and 4.

Figure 3:
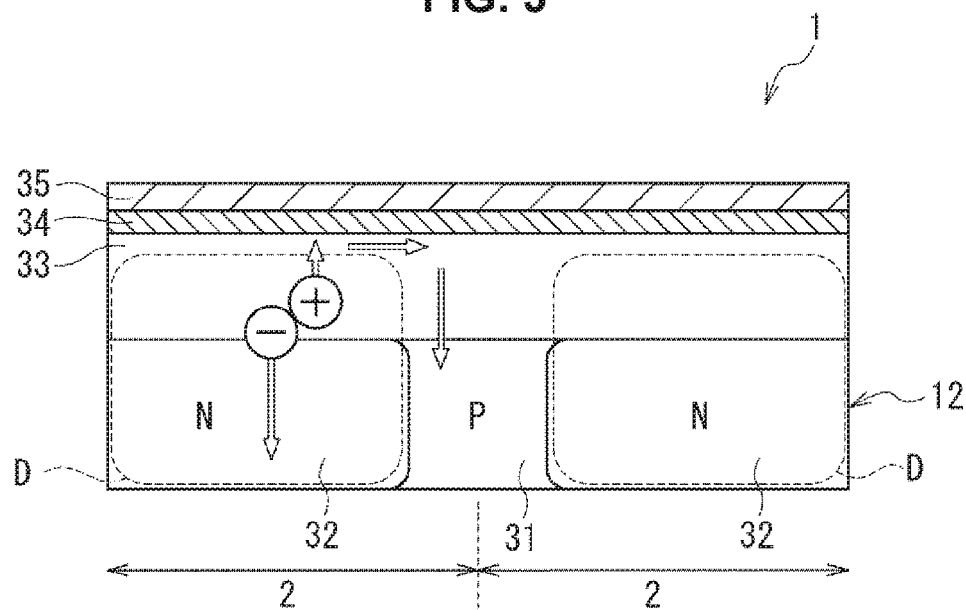
FIG. 3 is a diagram for describing the flows of electrons and holes in a pixel.
Figure 4:
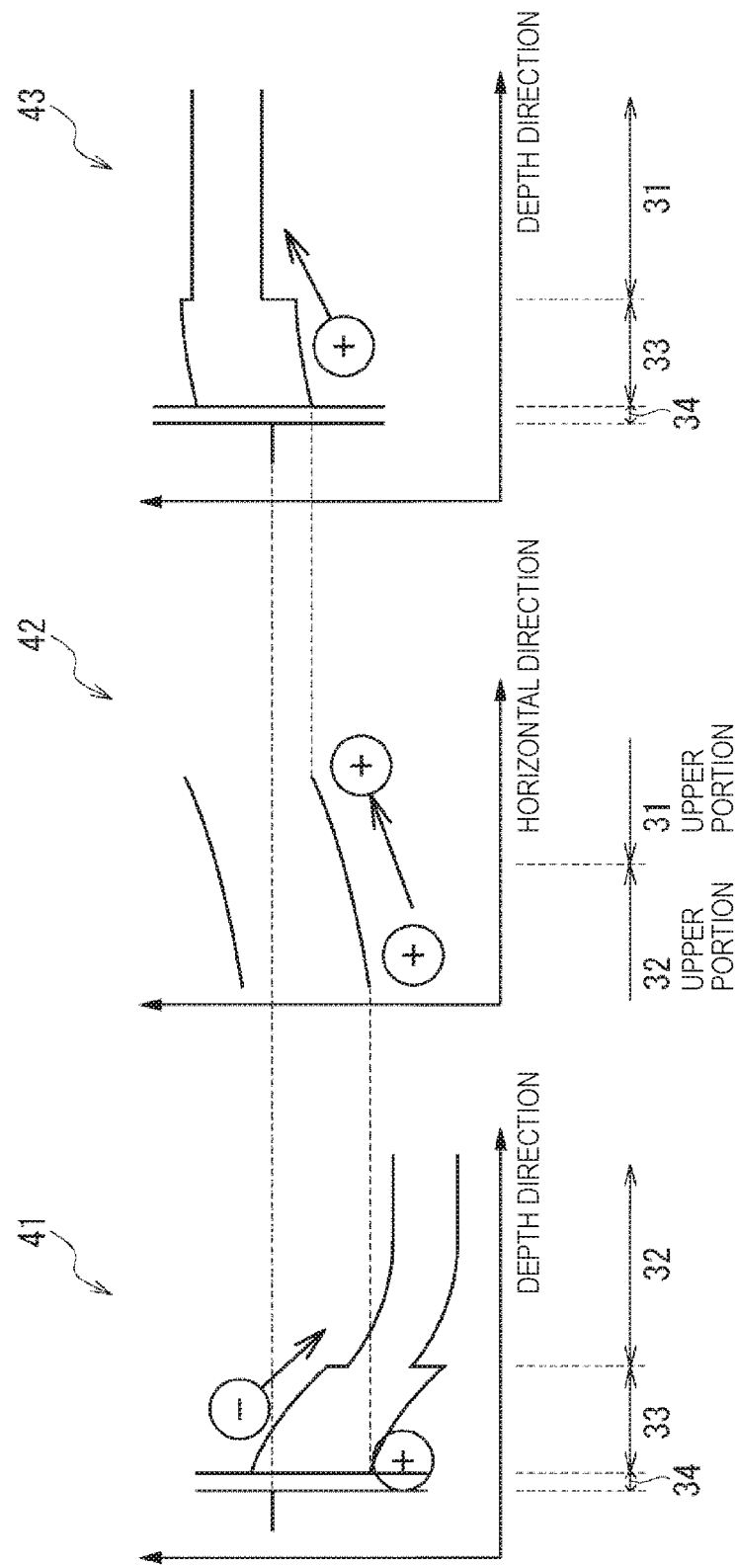
FIG. 4 is a diagram for describing the flows of electrons and holes in a pixel.

FIG. 3 illustrates the flows of electrons and holes generated in the depletion layer D of the pixel 2, and FIG. 4 illustrates a band diagram of a predetermined region in the pixel 2.

A band diagram of the three layers, that is, the n-type semiconductor region 32, the photoelectric conversion film 33, and the fixed charge film 34 including the region in which the depletion layer D is formed is indicated by a graph 41 of FIG. 4. Thus, the electrons generated in the depletion layer D are taken into the n-type semiconductor region 32 as signal charges, and the holes generated in the depletion layer D are moved to a portion of the photoelectric conversion film 33 near the fixed charge film 34 as illustrated in FIG. 3.

A band diagram in the horizontal direction in the photoelectric conversion film 33 is indicated by a graph 42 of FIG. 4 and is oblique as energy is increased toward a pixel boundary region in the upper portion of the p-type well region 31. Thus, as illustrated in FIG. 3, the hole moved to the portion near the fixed charge film 34 moves toward the upper portion of the p-type well region 31 in the horizontal direction.

A band diagram of the three layers, that is, the p-type well region 31, the photoelectric conversion film 33, and the fixed charge film 34 near the adjacent pixel boundary is indicated by a graph 43 of FIG. 4. Thus, the holes moved to the region of the photoelectric conversion film 33 above the p-type well region 31 move in the depth direction (the downward direction) of the semiconductor substrate 12 and are discharged from the p-type well region 31 to the ground (GND) as illustrated in FIG. 3.

As described above, in the pixel 2 according to the first embodiment, the pixel 2 has the structure having the n-type semiconductor region (silicon region) 32—the photoelectric conversion film 33—the fixed charge film 34—the insulation film 35, and the internal electric field can be applied by generating a fixed charge between the photoelectric conversion film 33 and the fixed charge film 34. Thus, even when an electrode is not formed above the photoelectric conversion film 33, the thickness of the depletion layer D in the photoelectric conversion film 33 can be controlled.

Next, modified examples of the first embodiment will be described.

In the modified examples of the first embodiment described below, portions corresponding to the basic form of the first embodiment illustrated in FIG. 2 are denoted by the same reference numerals, and the description will proceed with different portions from those of FIG. 2. In cross-sectional configuration diagrams of the pixel 2 of FIG. 5 and subsequent diagrams, the flows of the electrons and the holes in the pixel 2 are also illustrated together with the structure of the pixel 2, similarly to FIG. 3.

First and Second Modified Examples

Figure 5:
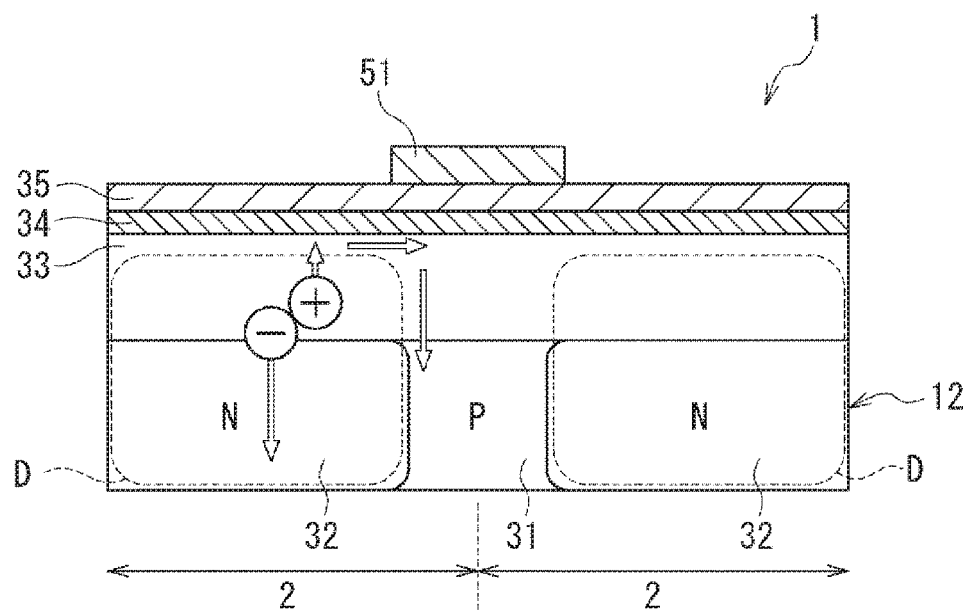
FIG. 5 is a schematic configuration cross-sectional view of a first modified example of the first embodiment.
Figure 6:
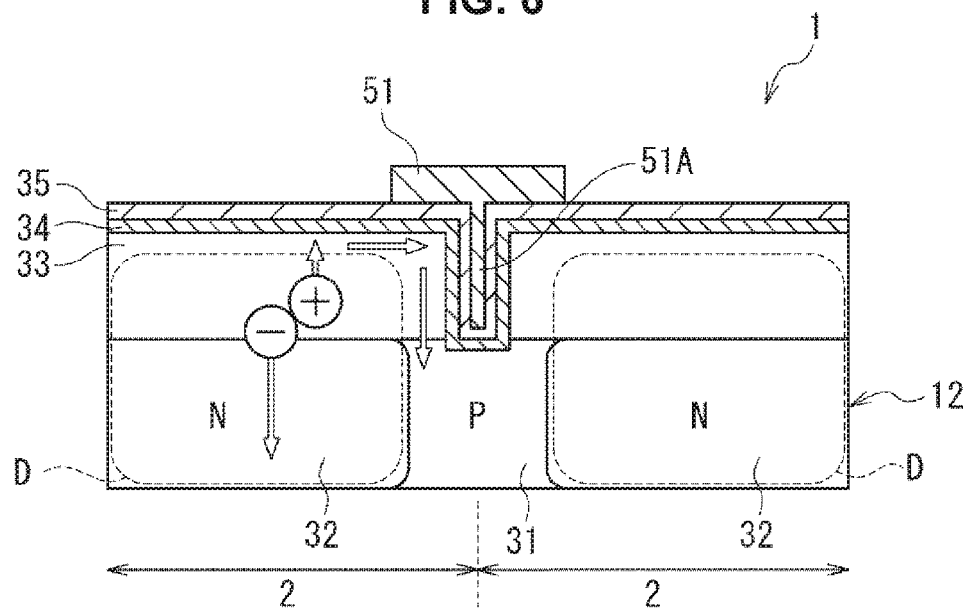
FIG. 6 is a schematic configuration cross-sectional view of a second modified example of the first embodiment.

FIG. 5 illustrates a schematic configuration cross-sectional view of a first modified example of the first embodiment, and FIG. 6 illustrates a schematic configuration cross-sectional view of a second modified example of the first embodiment.

The first and second modified examples differ from the basic form of FIG. 2 in that a light shielding film 51 that prevents the leakage of incident light from a neighboring pixel 2 is formed on the insulation film 35 above the p-type well region 31 serving as the boundary of a neighboring pixel 2.

In the first modified example illustrated in FIG. 5, the light shielding film 51 is formed on only the top surface of the insulation film 35, whereas in the second modified example illustrated in FIG. 6, the light shielding film 51 includes a trench portion 51A recessed in the depth direction of the semiconductor substrate 12.

A material that shields light such as tungsten (W), aluminum (Al), or copper (Cu) may be used as a material of the light shielding film 51.

In the first and second modified examples, the electrons generated in the depletion layer D are taken into the n-type semiconductor region 32 as the signal charges, similarly to the basic form of FIG. 2. Meanwhile, the holes generated in the depletion layer D move to the portion near the fixed charge film 34, then move in the horizontal direction, then move in the depth direction, and are discharged to the ground (GND) via the p-type well region 31, similarly to the basic form of FIG. 2.

A negative bias may be applied to the light shielding film 51.

Third and Fourth Modified Examples

Figure 7:
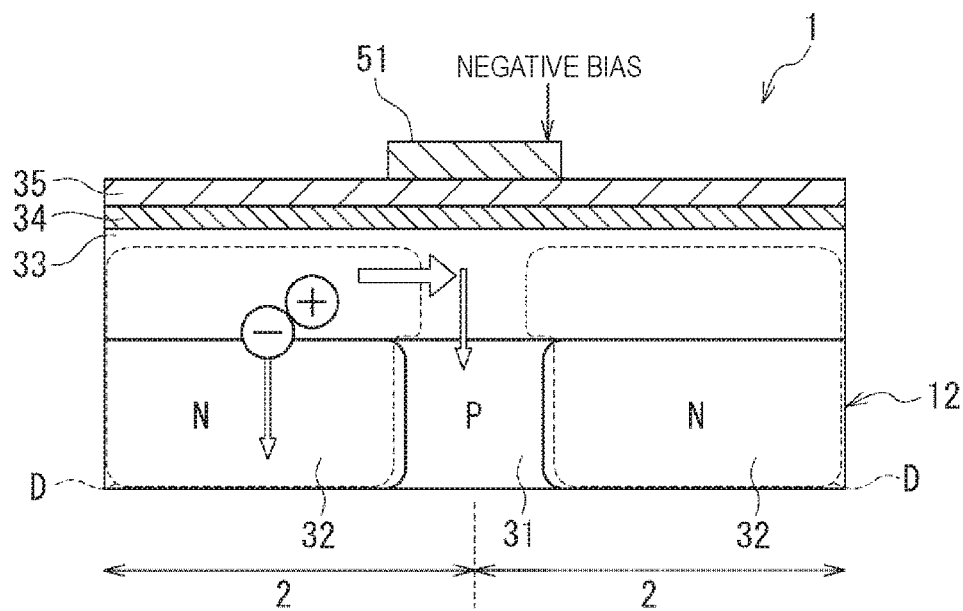
FIG. 7 is a schematic configuration cross-sectional view of a third modified example of the first embodiment.
Figure 8:
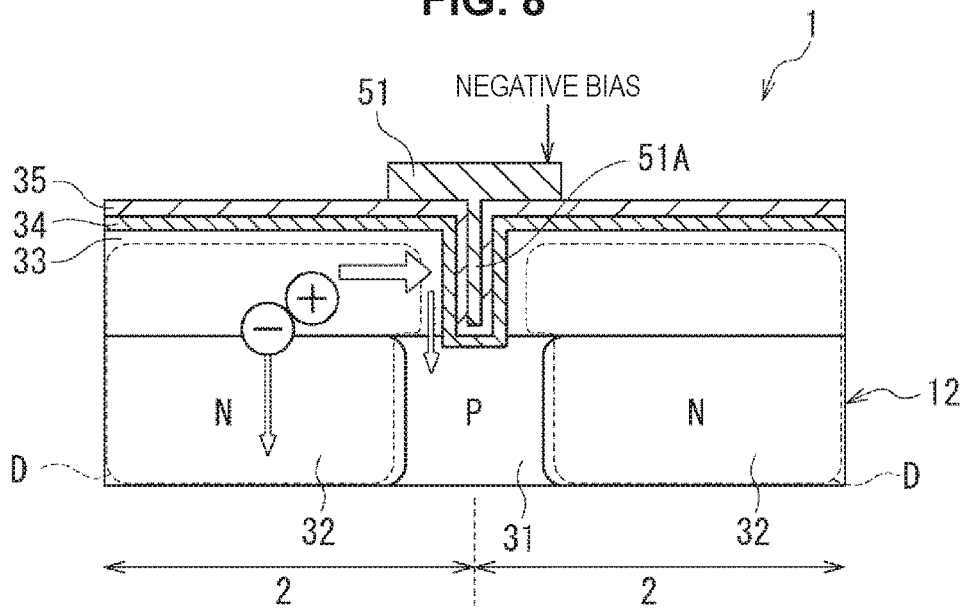
FIG. 8 is a schematic configuration cross-sectional view of a fourth modified example of the first embodiment.

FIGS. 7 and 8 illustrate examples in which a negative bias is applied to the light shielding films 51 of the first and second modified examples as third and fourth modified examples of the first embodiment.

When the negative bias is applied to the light shielding film 51, the depletion layer D is expanded toward the light shielding film 51 side in the photoelectric conversion film 33 as illustrated in FIGS. 7 and 8. As a result, the holes generated in the depletion layer D move in the fixed charge film 34 in the horizontal direction, then move in the depth direction, and are discharged to the ground (GND) via the p-type well region 31.

Fifth to Seventh Modified Examples

Figure 9:
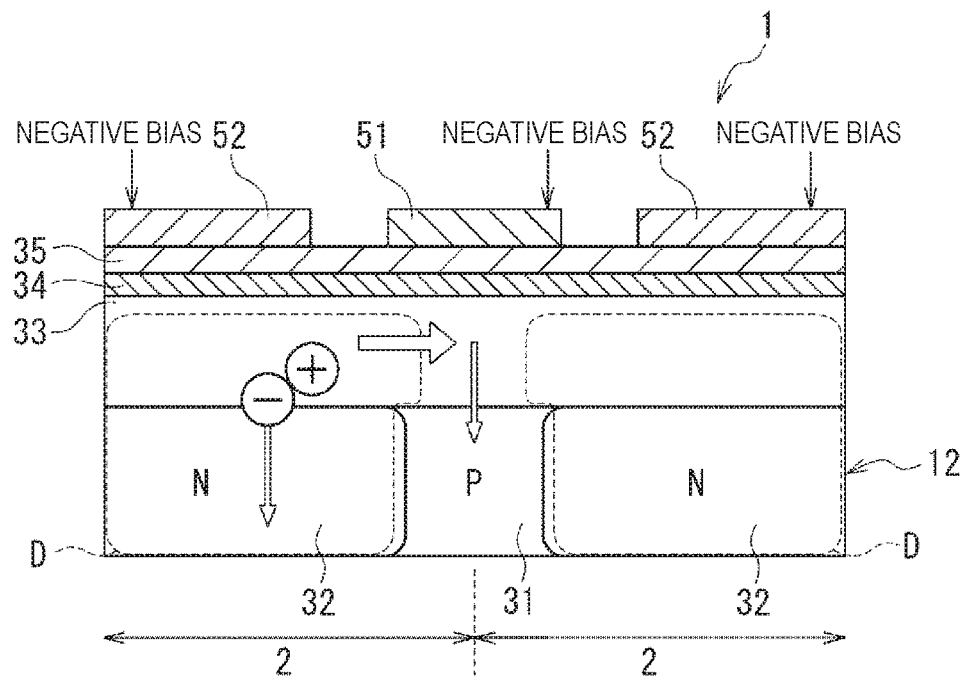
FIG. 9 is a schematic configuration cross-sectional view of a fifth modified example of the first embodiment.
Figure 10:
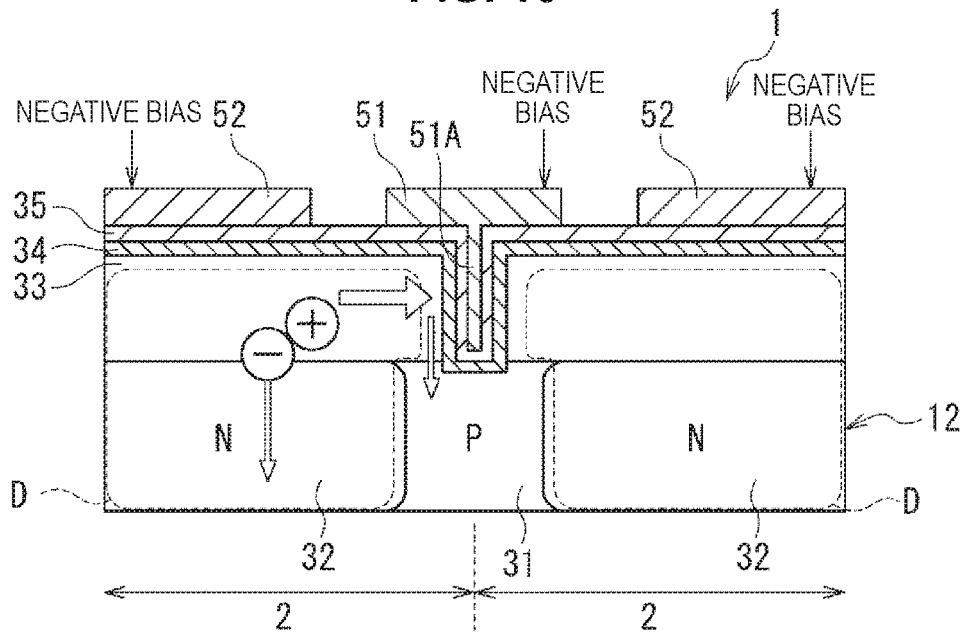
FIG. 10 is a schematic configuration cross-sectional view of a sixth modified example of the first embodiment.

FIGS. 9 and 10 illustrate fifth and sixth modified examples of the first embodiment.

In the fifth modified example illustrated in FIG. 9, in addition to the structure of the third modified example illustrated in FIG. 7, a transparent electrode 52 is additionally formed on the insulation film 35 above the n-type semiconductor region 32 serving as the charge accumulation portion of each pixel 2. A transparent conductive material such as indium tin oxide (ITO), zinc oxide, or indium zinc oxide is used as a material of the transparent electrode 52. The negative bias is applied to the transparent electrode 52.

In the sixth modified example illustrated in FIG. 10, in addition to the structure of the fourth modified example illustrated in FIG. 8, a transparent electrode 52 is additionally formed on the insulation film 35 above the n-type semiconductor region 32 serving as the charge accumulation portion of each pixel 2. The negative bias is applied to the transparent electrode 52.

Figure 11:
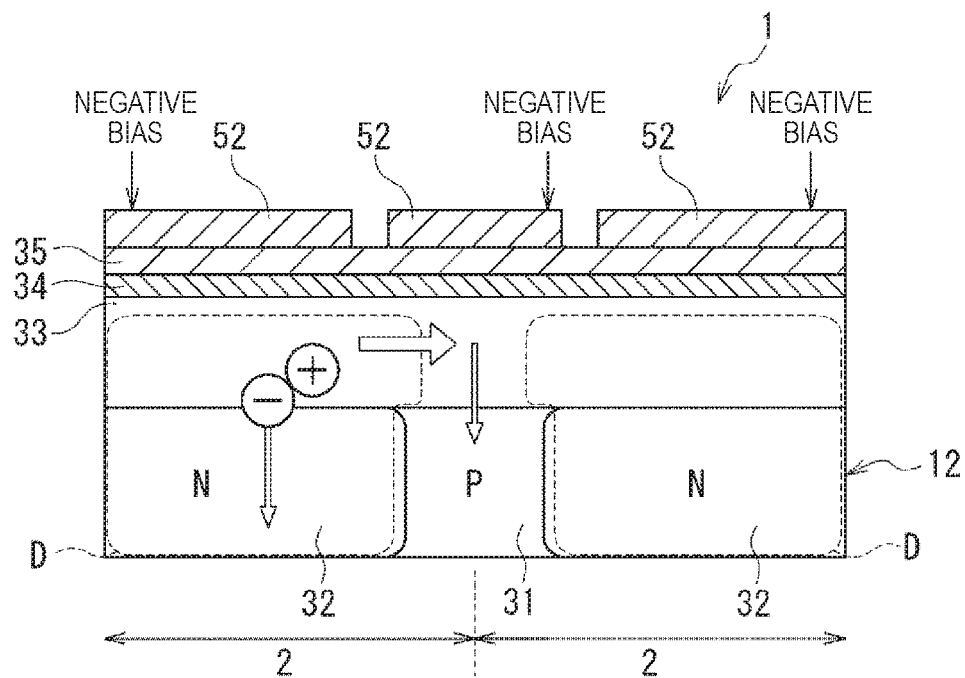
FIG. 11 is a schematic configuration cross-sectional view of a seventh modified example of the first embodiment.

FIG. 11 illustrates a seventh modified example of the first embodiment.

In the seventh modified example illustrated in FIG. 11, a transparent electrode 52 is formed instead of the light shielding film 51 of the structure of the fifth modified example illustrated in FIG. 9, and the negative bias is applied to the transparent electrode 52.

In the fifth to seventh modified examples, the electrons generated in the depletion layer D are taken into the n-type semiconductor region 32 as the signal charges, similarly to the basic form of FIG. 2. Meanwhile, the holes generated in the depletion layer D move in the photoelectric conversion film 33 toward the upper portion of the p-type well region 31 in the horizontal direction, then move in the depth direction (the downward direction), and are discharged to the ground (GND) via the p-type well region 31.

In the third to seventh modified examples, in addition to the internal electric field due to the photoelectric conversion film 33 and the fixed charge film 34, an external electric field is applied, and thus the thickness of the depletion layer D in the photoelectric conversion film 33 can be controlled.

<3. Pixel According to Second Embodiment>

Figure 12:
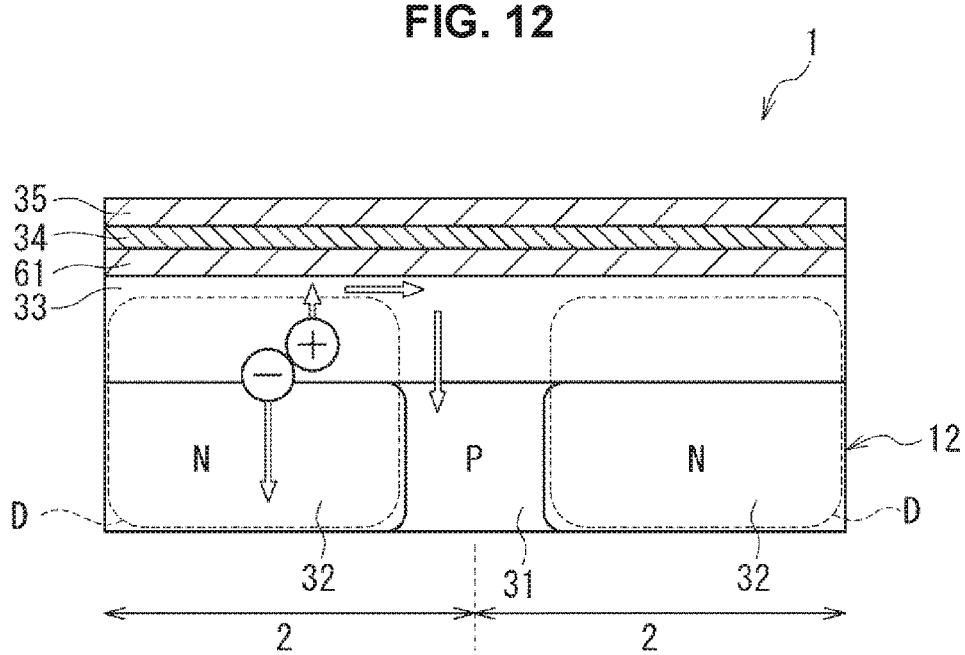
FIG. 12 is a schematic configuration cross-sectional view of a pixel according to a second embodiment.

FIG. 12 illustrates a schematic configuration cross-sectional view of a pixel 2 according to a second embodiment.

In the description of the second embodiment, portions corresponding to the basic form of the first embodiment illustrated in FIG. 2 are denoted by the same reference numerals, and the description will proceed with different portions from those of FIG. 2. In cross-sectional configuration diagrams of the pixel 2 of FIG. 12 and subsequent diagrams, the flows of the electrons and the holes in the pixel 2 are also illustrated together with the structure of the pixel 2, similarly to FIG. 3.

The second embodiment of FIG. 12 differs from the first embodiment in that an insulation film 61 is further formed between the photoelectric conversion film 33 and the fixed charge film 34. The insulation film 61 may be formed of the same material as or a different material from the material of the insulation film 35.

By forming the insulation film 61 between the photoelectric conversion film 33 and the fixed charge film 34, the fixed charge can be generated more effectively than in the pixel structure of the first embodiment. Further, by adjusting the film thickness or the density of the insulation film 61, an amount of fixed charge can be adjusted, and the thickness of the depletion layer D in the photoelectric conversion film 33 can be controlled.

In the second embodiment, the pixel 2 has the structure having the n-type semiconductor region (silicon region) 32—the photoelectric conversion film 33—the insulation film 61—the fixed charge film 34—the insulation film 35, and the internal electric field can be applied by generating the fixed charge between the insulation film 61 and the fixed charge film 34. Thus, even when an electrode is not formed above the photoelectric conversion film 33, the thickness of the depletion layer D in the photoelectric conversion film 33 can be controlled. The flows of the electrons and the holes generated in the depletion layer D are the same as the flows described with reference to FIG. 3.

Next, modified examples of the second embodiment will be described.

In the modified examples of the second embodiment described below, portions corresponding to the basic form of the second embodiment illustrated in FIG. 12 are denoted by the same reference numerals, and the description will proceed with different portions from those of FIG. 12.

First and Second Modified Examples

Figure 13:
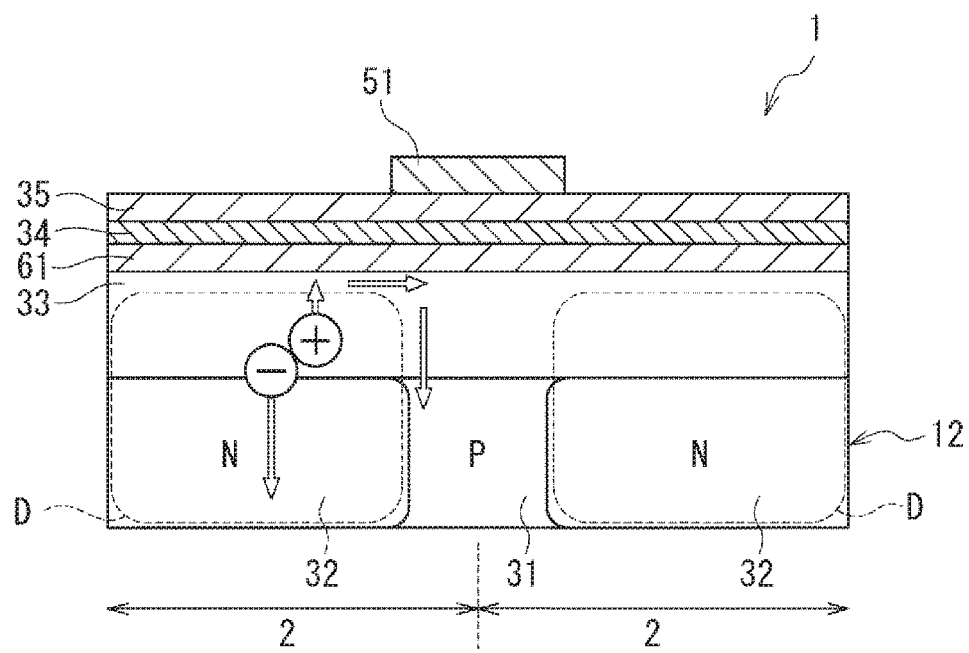
FIG. 13 is a schematic configuration cross-sectional view of a first modified example of the first embodiment.
Figure 14:
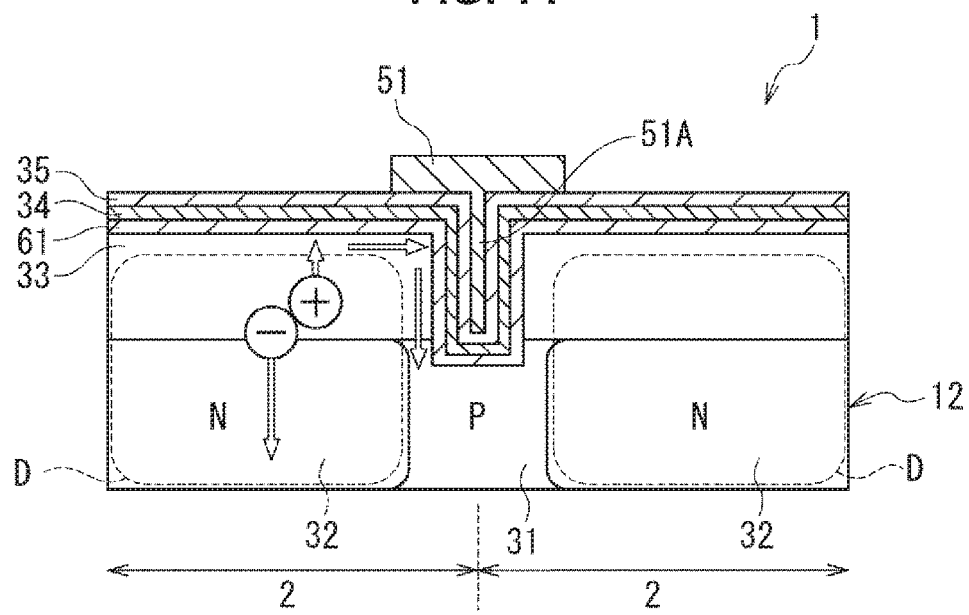
FIG. 14 is a schematic configuration cross-sectional view of a second modified example of the first embodiment.

FIG. 13 illustrates a schematic configuration cross-sectional view of a first modified example of the second embodiment, and FIG. 14 illustrates a schematic configuration cross-sectional view of a second modified example of the second embodiment.

The first and second modified examples differ from the basic form of FIG. 12 in that a light shielding film 51 that prevents the leakage of incident light from a neighboring pixel 2 is formed on the insulation film 35 above the p-type well region 31 serving as the boundary of a neighboring pixel 2.

In the first modified example illustrated in FIG. 13, the light shielding film 51 is formed on only the top surface of the insulation film 35, whereas in the second modified example illustrated in FIG. 14, the light shielding film 51 includes a trench portion 51A recessed in the depth direction of the semiconductor substrate 12.

A material that shields light such as tungsten (W), aluminum (Al), or copper (Cu) may be used as a material of the light shielding film 51.

In the first and second modified examples, the electrons generated in the depletion layer D are taken into the n-type semiconductor region 32 as the signal charges, similarly to the basic form of FIG. 12. Meanwhile, the holes generated in the depletion layer D move to the portion near the fixed charge film 34, then move in the horizontal direction, then move in the depth direction, and are discharged to the ground (GND) via the p-type well region 31, similarly to the basic form of FIG. 12.

The negative bias may be applied to the light shielding film 51.

Third and Fourth Modified Examples

Figure 15:
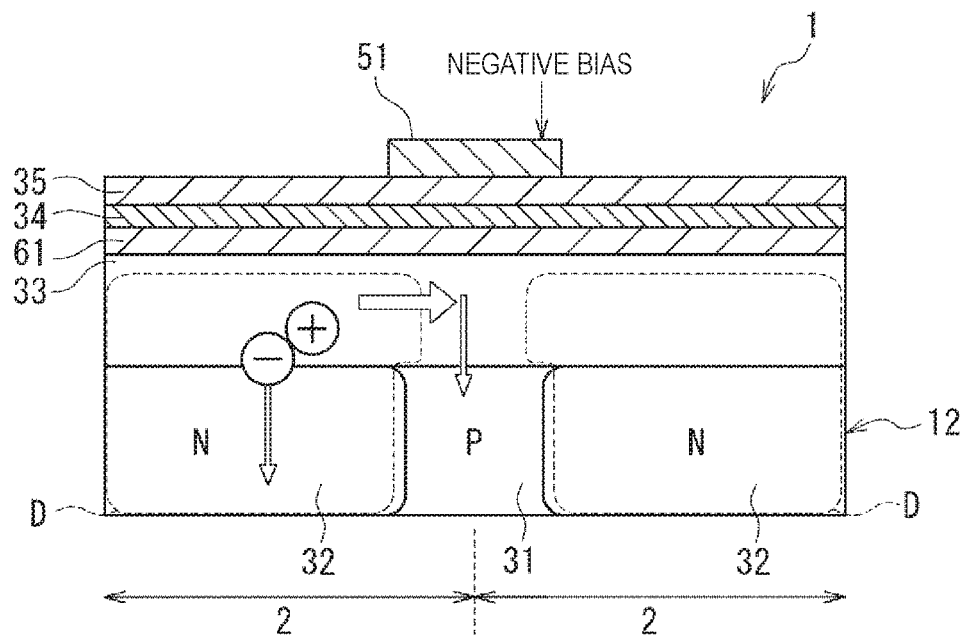
FIG. 15 is a schematic configuration cross-sectional view of a third modified example of the first embodiment.
Figure 16:
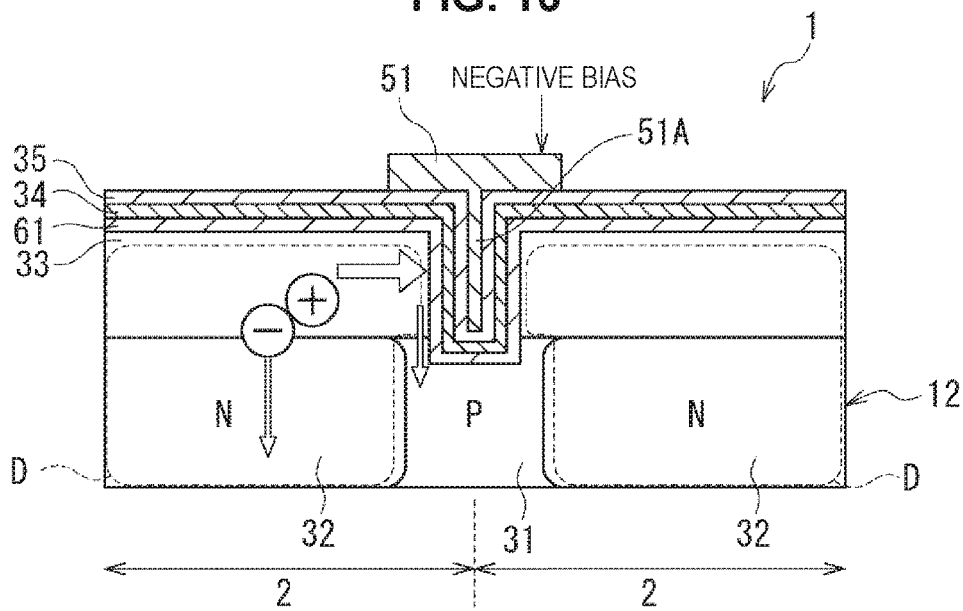
FIG. 16 is a schematic configuration cross-sectional view of a fourth modified example of the first embodiment.

FIGS. 15 and 16 illustrate examples in which a negative bias is applied to the light shielding films 51 of the first and second modified examples as third and fourth modified examples of the second embodiment.

When the negative bias is applied to the light shielding film 51, the depletion layer D is expanded toward the light shielding film 51 side in the photoelectric conversion film 33 as illustrated in FIGS. 15 and 16. As a result, the holes generated in the depletion layer D move in the fixed charge film 34 in the horizontal direction, then move in the depth direction, and are discharged to the ground (GND) via the p-type well region 31.

Fifth to Seventh Modified Examples

Figure 17:
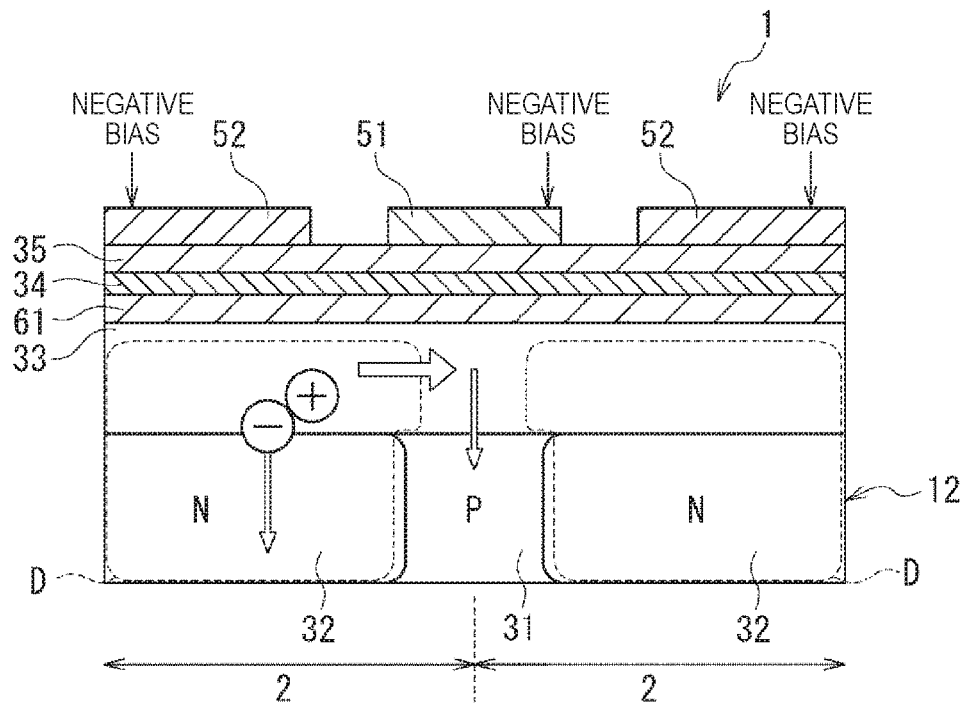
FIG. 17 is a schematic configuration cross-sectional view of a fifth modified example of the first embodiment.
Figure 18:
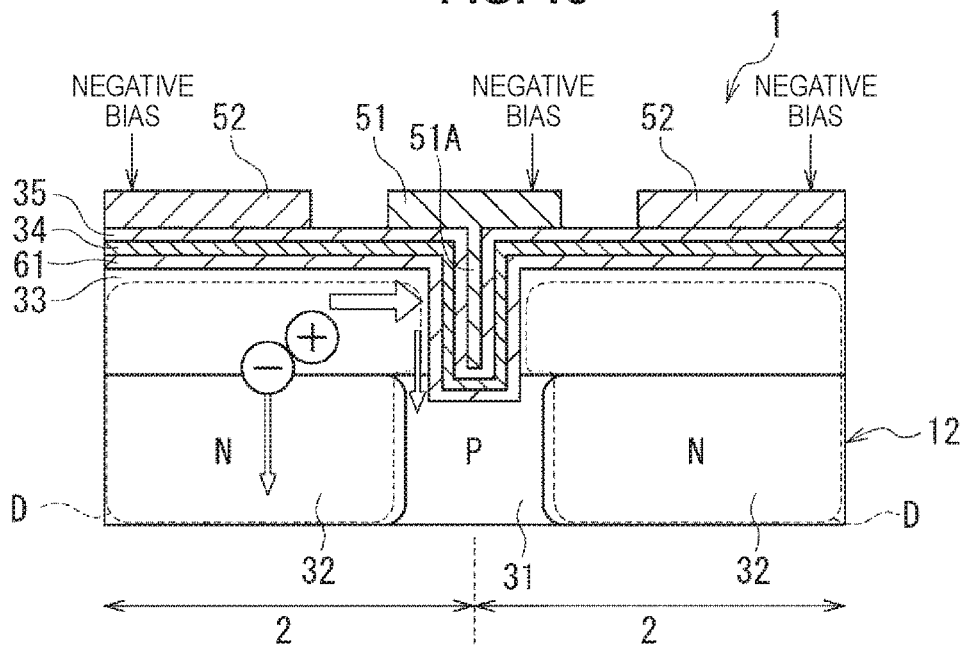
FIG. 18 is a schematic configuration cross-sectional view of a sixth modified example of the first embodiment.

FIGS. 17 and 18 illustrate fifth and sixth modified examples of the second embodiment.

In the fifth modified example illustrated in FIG. 17, in addition to the structure of the third modified example illustrated in FIG. 15, a transparent electrode 52 is additionally formed on the insulation film 35 above the n-type semiconductor region 32 serving as the charge accumulation portion of each pixel 2. A transparent conductive material such as indium tin oxide (ITO), zinc oxide, or indium zinc oxide is used as a material of the transparent electrode 52. The negative bias is applied to the transparent electrode 52.

In the sixth modified example illustrated in FIG. 18, in addition to the structure of the fourth modified example illustrated in FIG. 16, a transparent electrode 52 is additionally formed on the insulation film 35 above the n-type semiconductor region 32 serving as the charge accumulation portion of each pixel 2. The negative bias is applied to the transparent electrode 52.

Figure 19:
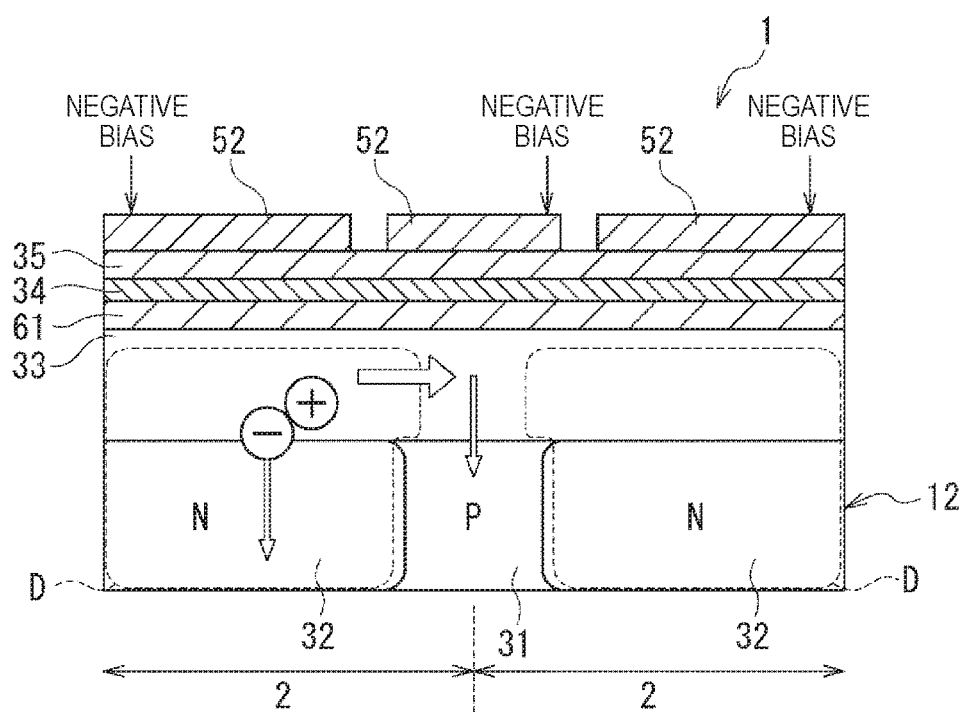
FIG. 19 is a schematic configuration cross-sectional view of a seventh modified example of the first embodiment.

FIG. 19 illustrates a seventh modified example of the second embodiment.

In the seventh modified example illustrated in FIG. 19, a transparent electrode 52 is formed instead of the light shielding film 51 of the structure of the fifth modified example illustrated in FIG. 17, and the negative bias is applied to the transparent electrode 52.

In the fifth to seventh modified examples, the electrons generated in the depletion layer D are taken into the n-type semiconductor region 32 as the signal charges, similarly to the basic form of FIG. 12. Meanwhile, the holes generated in the depletion layer D move in the photoelectric conversion film 33 toward the upper portion of the p-type well region 31 in the horizontal direction, then move in the depth direction (the downward direction), and are discharged to the ground (GND) via the p-type well region 31.

In the third to seventh modified examples, in addition to the internal electric field due to the insulation film 61 and the fixed charge film 34, an external electric field is applied, and thus the thickness of the depletion layer D in the photoelectric conversion film 33 can be controlled.

<4. Manufacturing Method>

A manufacturing method of the basic form of the pixel 2 illustrated in FIG. 2 according to the first embodiment will be described with reference to FIG. 20.

First, the n-type semiconductor region 32 serving as the charge accumulation portion is formed in the p-type well region 31 of the semiconductor substrate 12 for each pixel 12. Although not illustrated, at this point, the read circuit and the multi-layer interconnection layer have already been formed on the front surface side of the semiconductor substrate 12.

Figure 20:
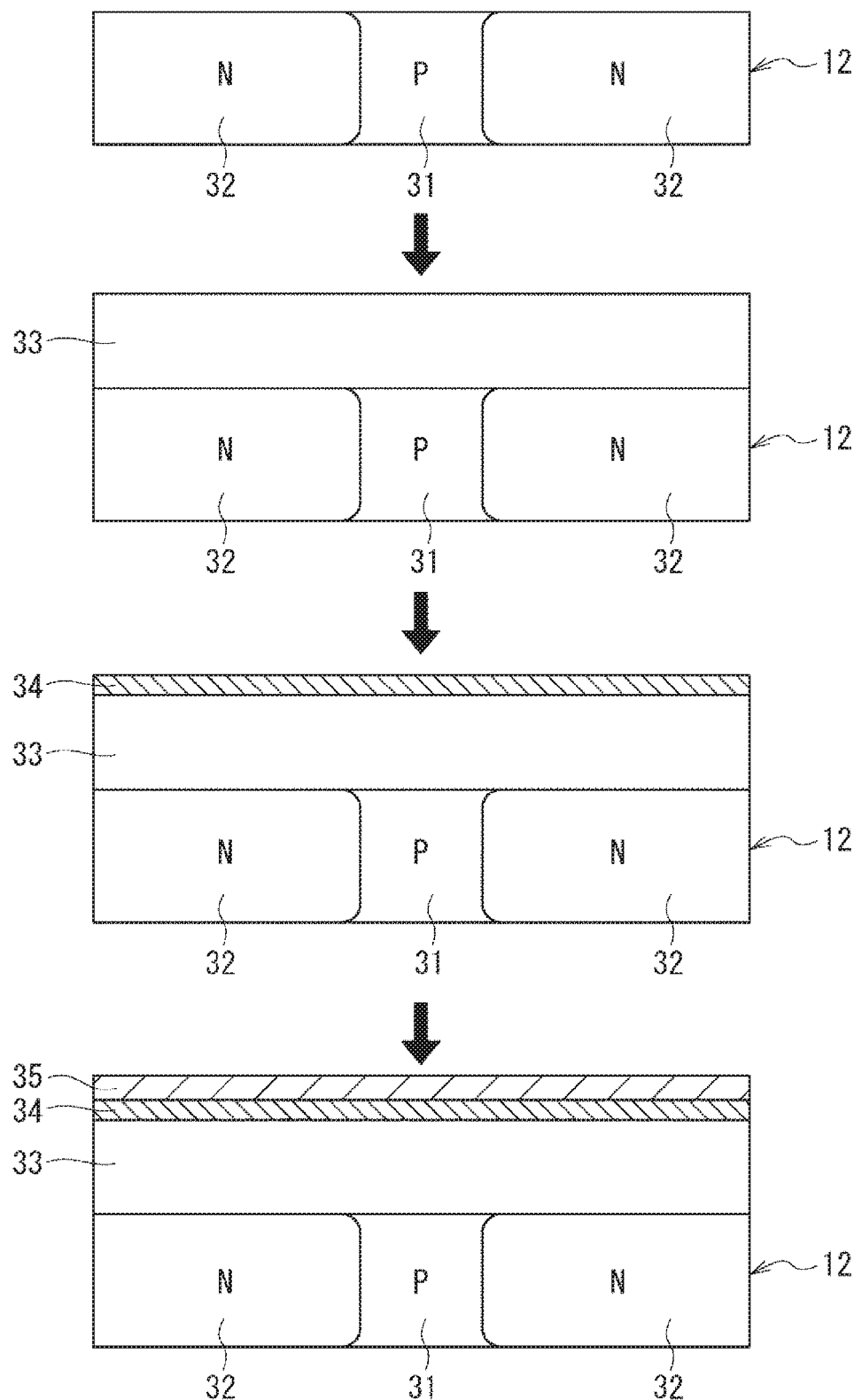
FIG. 20 is a diagram for describing a method of manufacturing a pixel according to the first embodiment.

Then, the photoelectric conversion film 33, the fixed charge film 34, and the insulation film 35 are formed on the top surface of the back surface side of the semiconductor substrate 12 in which the n-type semiconductor region 32 is formed for each pixel 2 in the described order as illustrated in FIG. 20.

Thereafter, the color filter layer and the on-chip lens are further formed on the insulation film 35.

The pixel structure of the basic form of the pixel 2 according to the first embodiment can be formed as described above.

In a manufacturing method of the basic form of the pixel 2 according to the second embodiment, preferably, after the photoelectric conversion film 33 is formed, the insulation film 61 is formed, and then the fixed charge film 34 is formed.

<5. Application Example to Electronic Device>

The technology of the present disclosure is not limited to an application to the solid-state image capturing element. In other words, the technology of the present disclosure can be applied to all electronic devices using a solid-state image capturing element as an image capturing unit (photoelectric conversion unit) such as image capturing devices including digital still cameras, video cameras, and the like, mobile terminal devices having an image capturing function, copy machines using a solid-state image capturing element as an image reading unit. The solid-state image capturing element may be formed as one chip or may be a module form having an image capturing function with which an image capturing unit, a signal processing unit, or an optical system are packaged together.

Figure 21:
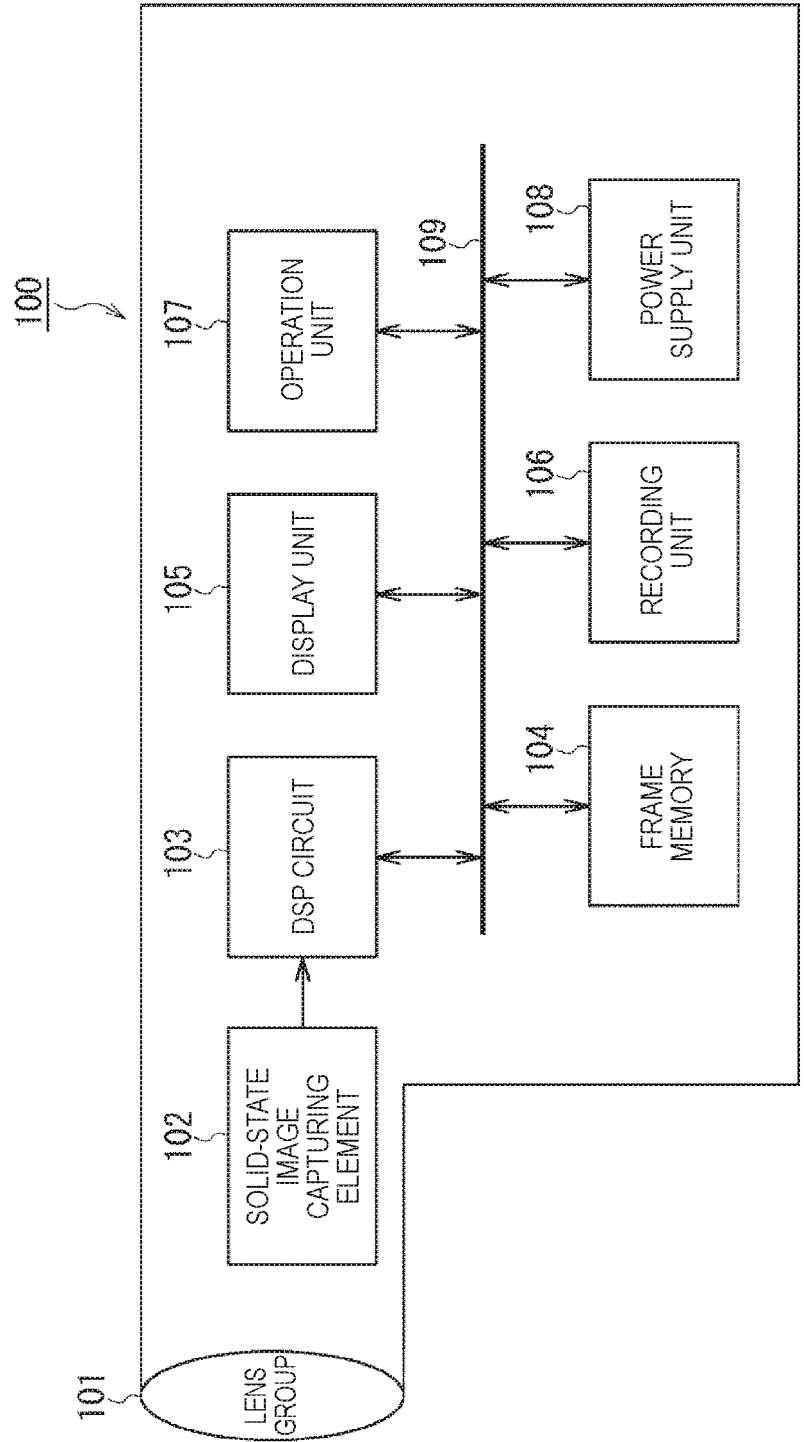
FIG. 21 is a block diagram illustrating an exemplary configuration of an image capturing device as an electronic device according to the present disclosure.

FIG. 21 is a block diagram illustrating an exemplary configuration of an image capturing device as an electronic device according to the present disclosure.

An image capturing device 100 of FIG. 21 includes an optical unit 101 including a lens group, a solid-state image capturing element (an image capturing device) 102 employing the configuration of the solid-state image capturing element 1 of FIG. 1, and a digital signal processor (DSP) circuit 103 serving as a camera signal processing circuit. The image capturing device 100 further includes a frame memory 104, a display unit 105, a recording unit 106, an operation unit 107, and a power supply unit 108. The DSP circuit 103, the frame memory 104, the display unit 105, the recording unit 106, the operation unit 107, and the power supply unit 108 are connected to one another via a bus line 109.

The optical unit 101 captures incident light (image light) from a subject, and forms an image on an imaging plane of the solid-state image capturing element 102. The solid-state image capturing element 102 converts an amount of the incident light whose image is formed on the imaging plane by the optical unit 101 into an electric signal in units of pixels, and outputs the electric signal as the pixel signal. As the solid-state image capturing element 102, the solid-state image capturing element 1 having the pixel structure illustrated in FIG. 2 or FIG. 12, that is, the solid-state image capturing element in which the fixed charge film 34 is formed without using the electrode, and the internal electric field can be applied by generating the fixed charge may be used.

The display unit 105 includes a panel type display device such as a liquid crystal display panel or an organic electro luminescence (EL) panel, and displays a moving image or a still image captured by the solid-state image capturing element 102. The recording unit 106 records the moving image or the still image captured by the solid-state image capturing element 102 in a recording medium such as a hard disk or a semiconductor memory.

The operation unit 107 issues an operation command for various functions with which the image capturing device 100 is provided under an operation performed by the user. The power supply unit 108 appropriately supplies various types of electric power serving as operation power of the DSP circuit 103, the frame memory 104, the display unit 105, the recording unit 106, and the operation unit 107 to a supply target.

As described above, high sensitivity can be implemented by employing the pixel structures of the solid-state image capturing element 1 described above as the solid-state image capturing element 102. Thus, the quality of a captured image can be increased even in the image capturing device 100 such as camera modules for mobile devices including video cameras, digital still cameras, or mobile phones.

In the above example, the solid-state image capturing elements in which the p type and the n type are used as the first and second conductivity types, and the electrons are used as the signal charges have been described. However, the technology of the present disclosure can be applied to a solid-state image capturing element in which the holes are used as the signal charges. In other words, the semiconductor regions described above may be configured with semiconductor regions of opposite conductivity types using the n type and the p type as the first and second conductivity types.

The technology of the present disclosure is not limited to the application to the solid-state image capturing element that detects a distribution of an incident light amount of visible light and captures an image thereof and can be applied to all solid-state image capturing elements that capture an image of a distribution of an incidence amount of infrared rays, X rays, particles, or the like or all solid-state image capturing elements (physical amount distribution detection devices) such as fingerprint detection sensors that detect a distribution of other physical amounts such as pressure or capacitance and captures an image thereof as a broad meaning.

Embodiments of the present disclosure are not limited to the above embodiments, and various changes may be made within the scope while not departing from the gist of the present disclosure.

For example, a form in which all or some of a plurality of embodiments described above are combined may be employed.

The effects described in this specification are merely exemplary and are not to be limited, and any other effect described in this specification may be included. Additionally, the present technology may also be configured as below.

(1)

A solid-state image capturing element, including:

pixels each including a photoelectric conversion film and a fixed charge film stacked on a semiconductor substrate, the photoelectric conversion film being configured to perform photoelectric conversion on incident light, the fixed charge film being configured to have a predetermined fixed charge.

(2)

The solid-state image capturing element according to (1), further including:

a charge accumulation portion configured to accumulate signal charges obtained by the photoelectric conversion performed by the photoelectric conversion film, the charge accumulation portion being formed below the photoelectric conversion film.

(3)

The solid-state image capturing element according to (2), wherein the charge accumulation portion is a semiconductor region of the semiconductor substrate.

(4)

The solid-state image capturing element according to any of (1) to (3), further including:

an insulation film formed on the fixed charge film.

(5)

The solid-state image capturing element according to (4), wherein a film thickness of the insulation film is a predetermined thickness of 500 nm or less.

(6)

The solid-state image capturing element according to any of (1) to (5), further including:

an insulation film formed between the photoelectric conversion film and the fixed charge film.

(7)

The solid-state image capturing element according to any of (1) to (6), wherein the fixed charge film is formed of one layer.

(8)

The solid-state image capturing element according to any of (1) to (6), wherein the fixed charge film is formed of two layers.

(9)

The solid-state image capturing element according to any of (1) to (8), wherein a film thickness of the fixed charge film is a predetermined thickness within a range of 10 nm to 100 nm.

(10)

The solid-state image capturing element according to any of (1) to (9), wherein a material of the fixed charge film includes at least one of hafnium, aluminum, titanium, tantalum, lanthanum, yttrium, gadolinium, and zirconium.

(11)

The solid-state image capturing element according to any of (1) to (10), wherein a material of the photoelectric conversion film is a compound semiconductor having a chalcopyrite structure.

(12)

The solid-state image capturing element according to any of (1) to (11), wherein the solid-state image capturing element is a back surface irradiation type in which the incident light is incident from a back surface side of the semiconductor substrate.

(13)

The solid-state image capturing element according to any of (1) to (12),
wherein the pixel includes a light shielding film configured to shield the incident light, the light shielding film being formed above the fixed charge film of a pixel boundary.

(14)

The solid-state image capturing element according to (13),
wherein the light shielding film includes a trench portion.

(15)

The solid-state image capturing element according to any of (1) to (14),
wherein the pixel includes a transparent electrode formed above the fixed charge film above a charge accumulation portion of the semiconductor substrate.

(16)

The solid-state image capturing element according to (15),
wherein the pixel includes a transparent electrode above the fixed charge film of a pixel boundary as well.

(17)

A method of manufacturing a solid-state image capturing element, including:
in forming pixels of the solid-state image capturing element,
forming a photoelectric conversion film configured to perform photoelectric conversion on incident light on a semiconductor substrate; and
forming a fixed charge film having a predetermined fixed charge on the photoelectric conversion film.

(18)

An electronic device, including:
a solid-state image capturing element including pixels each of which includes a photoelectric conversion film and a fixed charge film stacked on a semiconductor substrate, the photoelectric conversion film being configured to perform photoelectric conversion on incident light, the fixed charge film being configured to have a predetermined fixed charge.

REFERENCE SIGNS LIST 1 solid-state image capturing element
2 pixel
12 semiconductor substrate
31 p-type well region
32 n-type semiconductor region
33 photoelectric conversion film
34 fixed charge film
35 insulation film
51 light shielding film
51A trench portion
52 transparent electrode
61 insulation film
100 image capturing device
102 solid-state image capturing element

The invention claimed is:

1. An imaging device comprising:
a semiconductor region including a photoelectric conversion region and a first conductive type region, and the photoelectric conversion region including a compound semiconductor;
a layer disposed above the semiconductor region; and
a transparent electrode disposed above the layer,
wherein a charge generated from the photoelectric conversion region is transferred via the first conductive type region.

2. The imaging device according to claim 1, wherein the transparent electrode includes at least one of indium tin oxide, zinc oxide, or indium zinc oxide.

3. The imaging device according to claim 1, wherein the layer is a film having a charge.

4. The imaging device according to claim 1, wherein the layer is an insulating film.

5. The imaging device according to claim 1, wherein the compound semiconductor includes a chalcopyrite structure.

6. The imaging device according to claim 1, further comprising:
a second conductive type region in the semiconductor region.

7. The imaging device according to claim 6, wherein the charge generated from the photoelectric conversion region is transferred via the second conductive type region.

8. The imaging device according to claim 1, wherein the transparent electrode is applied a bias.

9. The imaging device according to claim 1, further comprising:
a metal region disposed above the layer.

10. The imaging device according to claim 1, wherein the first conductive type region is p-type region.

11. The imaging device according to claim 6, wherein the second conductive type region is n-type region.

12. The imaging device according to claim 6, wherein the first conductive type region is adjacent to the second conductive type region.

13. The imaging device according to claim 9, wherein the metal region includes at least one of tungsten, aluminum, or copper.

14. The imaging device according to claim 9, wherein a portion of the metal region is disposed in a portion of the semiconductor region.

15. The imaging device according to claim 1, wherein the first conductive type region is connected to a ground potential.

16. The imaging device according to claim 1, wherein the layer includes at least one of hafnium, aluminum, titanium, tantalum, lanthanum, yttrium, gadolinium, or zirconium.

17. The imaging device according to claim 1, further comprising:
a transistor; and
an multi-layer interconnection layer at a side opposite to a light incident side of the semiconductor region.

18. The imaging device according to claim 17, wherein the imaging device is a back surface irradiation type in which an incident light is incident from a back surface side of a semiconductor substrate.

19. The imaging device according to claim 1, further comprising:
a color filter layer disposed above the layer; and
an on-chip lens layer disposed above the color filter layer.

20. An electric apparatus, comprising:
an imaging device comprising:
a semiconductor region including
a photoelectric conversion region and a conductive type region, and the photoelectric conversion region including a compound semiconductor;
a layer disposed above the semiconductor region; and
a transparent electrode disposed above the layer, wherein a charge generated from the photoelectric conversion region is transferred via the conductive type region.

\* \* \* \* \*